(12) United States Patent
Pan et al.

(10) Patent No.: US 9,754,788 B2
(45) Date of Patent: Sep. 5, 2017

(54) MANUFACTURING METHOD OF SEMICONDUCTOR STRUCTURE INCLUDING PLANARIZING A POLYSILICON LAYER OVER AN ARRAY AREA AND A PERIPHERY AREA

(71) Applicant: UNITED MICROELECTRONICS CORP., Hsinchu (TW)

(72) Inventors: Ji-Gang Pan, Beijing (CN); Han-Chuan Fang, Singapore (SG); Boon-Tiong Neo, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 129 days.

(21) Appl. No.: 14/797,478

(22) Filed: Jul. 13, 2015

(65) Prior Publication Data

US 2017/0018432 A1    Jan. 19, 2017

(51) Int. Cl.

| | |
|---|---|
| *H01L 21/28* | (2006.01) |
| *H01L 21/3205* | (2006.01) |
| *H01L 21/3213* | (2006.01) |
| *H01L 21/321* | (2006.01) |
| *H01L 27/11531* | (2017.01) |
| *H01L 27/11541* | (2017.01) |

(52) U.S. Cl.
CPC .... *H01L 21/28273* (2013.01); *H01L 21/3212* (2013.01); *H01L 21/32056* (2013.01); *H01L 21/32133* (2013.01); *H01L 21/32139* (2013.01); *H01L 27/11531* (2013.01); *H01L 27/11541* (2013.01)

(58) Field of Classification Search
CPC ......... H01L 21/28273; H01L 27/11531; H01L 21/32056; H01L 21/32139; H01L 21/32133; H01L 21/3212
See application file for complete search history.

(56) References Cited

U.S. PATENT DOCUMENTS

| | | | | |
|---|---|---|---|---|
| 5,455,190 A | * | 10/1995 | Hsu | ...................... H01L 29/7827 257/E21.41 |
| 5,911,110 A | * | 6/1999 | Yu | ...................... H01L 21/76224 148/DIG. 50 |
| 6,472,271 B1 | * | 10/2002 | Jeng | .................. H01L 21/31056 257/E21.246 |
| 7,148,104 B2 | | 12/2006 | Ding | |

(Continued)

*Primary Examiner* — John P Dulka
(74) *Attorney, Agent, or Firm* — WPAT, PC

(57) ABSTRACT

A manufacturing method of a semiconductor structure having an array area and a periphery area is provided. The manufacturing method includes the following steps. A substrate is provided. A plurality of trenches is formed on the substrate. The plurality of trenches is filled with insulating material to form at least one first insulating layer. A polysilicon layer is deposited on the substrate and the first insulating layer. A photoresist mask is formed on the periphery area. A portion of the polysilicon layer on the array area is etched, such that a top surface of the polysilicon layer on the array area is higher than the first insulating layer and lower than a top surface of the polysilicon layer on the periphery area. The photoresist mask is removed. A planarization process is implemented to remove a portion of the polysilicon layer on the array area and on the periphery area.

14 Claims, 4 Drawing Sheets

(56) References Cited

U.S. PATENT DOCUMENTS

| | | | | |
|---|---|---|---|---|
| 7,301,196 B2* | 11/2007 | Ding | ................... | H01L 27/115 |
| | | | | 257/316 |
| 7,432,205 B2* | 10/2008 | Teng | ................... | H01L 21/7684 |
| | | | | 216/79 |
| 7,541,240 B2* | 6/2009 | Pham | ................... | H01L 21/3212 |
| | | | | 438/257 |
| 8,129,278 B2* | 3/2012 | Neo | ................... | B24B 37/042 |
| | | | | 257/E21.23 |
| 9,117,695 B1* | 8/2015 | Pan | ................... | H01L 27/10894 |
| 2004/0145007 A1* | 7/2004 | Sumino | ................... | H01L 27/105 |
| | | | | 257/315 |
| 2004/0161937 A1* | 8/2004 | Asano | ................... | C09G 1/02 |
| | | | | 438/691 |
| 2004/0266111 A1* | 12/2004 | Lee | ................... | H01L 21/76224 |
| | | | | 438/264 |
| 2005/0092633 A1* | 5/2005 | Baechle | ................... | B65D 61/00 |
| | | | | 206/320 |
| 2005/0202632 A1* | 9/2005 | Ding | ................... | H01L 21/28273 |
| | | | | 438/257 |
| 2005/0212032 A1* | 9/2005 | Ding | ................... | H01L 21/28273 |
| | | | | 257/314 |
| 2006/0134845 A1* | 6/2006 | Pham | ................... | H01L 27/105 |
| | | | | 438/200 |
| 2007/0200180 A1* | 8/2007 | Irani | ................... | H01L 21/28282 |
| | | | | 257/374 |
| 2008/0242198 A1* | 10/2008 | Lau | ................... | B24B 1/00 |
| | | | | 451/37 |
| 2011/0171819 A1* | 7/2011 | Utsuno | ................... | H01L 27/115 |
| | | | | 438/591 |
| 2014/0057439 A1* | 2/2014 | Zhang | ................... | H01L 21/76801 |
| | | | | 438/693 |
| 2014/0117444 A1* | 5/2014 | Liu | ................... | H01L 27/088 |
| | | | | 257/337 |

* cited by examiner

MANUFACTURING METHOD OF SEMICONDUCTOR STRUCTURE INCLUDING PLANARIZING A POLYSILICON LAYER OVER AN ARRAY AREA AND A PERIPHERY AREA

TECHNICAL FIELD

The disclosure relates in general to a manufacturing method of a semiconductor structure, and more particularly to a manufacturing method of a semiconductor structure with a reverse mask process.

BACKGROUND

With a trend toward scaling down the size of the semiconductor device, the line width of interconnections has continuously shrunk. In general, the floating gates may have much influence on the line width and the yield rate of the semiconductor device, and their related manufacturing methods have become an important matter in the next-generation semiconductor device.

In current manufacturing processes, it is difficult to control the height and width of the floating gate. Such a condition will lead to a higher micro-loading and a worse within-wafer uniformity (i.e., the uniformity within a wafer). Accordingly, in order to overcome the drawback, there is a need to provide a modified method for manufacturing floating gates with better control.

SUMMARY

The disclosure is directed to a manufacturing method of a semiconductor structure with a reverse mask process for controlling the height and width of the floating gate more precisely, which may improve the micro-loading issue and the uniformity within the wafer.

In one aspect of the present invention, a manufacturing method of a semiconductor structure having an array area and a periphery area is provided. The manufacturing method includes the following steps. A substrate is provided. A plurality of trenches is formed on the substrate. The plurality of trenches is filled with insulating material to form at least one first insulating layer. A polysilicon layer is deposited on the substrate and the first insulating layer. A photoresist mask is formed on the periphery area. A portion of the polysilicon layer on the array area is etched, such that a top surface of the polysilicon layer on the array area is higher than the first insulating layer and lower than a top surface of the polysilicon layer on the periphery area. The photoresist mask is removed. A planarization process is implemented to remove a portion of the polysilicon layer on the array area and on the periphery area.

Figure 1:
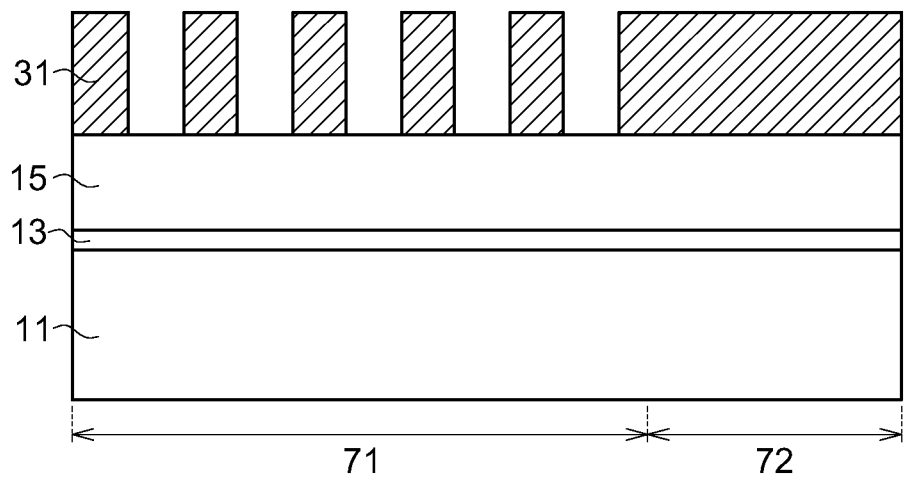
FIG. 1-6 show a process for manufacturing a semiconductor structure according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and that there may be other embodiments of the present disclosure which are not specifically illustrated. Thus, the specification and the drawings are regarded as an illustrative sense rather than a restrictive sense.

FIG. 1-6 show a process for manufacturing a semiconductor structure 100 according to an embodiment of the disclosure. In the embodiment of the disclosure, the semiconductor structure 100 may have an array area 71 and a periphery area 72. The manufacturing method of the semiconductor structure 100 may include the following steps.

As shown in FIG. 1, a substrate 11 is provided. The substrate 11 is, for example, a silicon substrate, and the conductive type of the substrate 11 may be p-type, but the disclosure is not limited thereto. Then, an oxide layer 13 and an insulating layer 15 may be deposited on the substrate 11. In this embodiment, the insulating layer 15 may include silicon nitride ($Si_3N_4$).

A photoresist mask 31 is formed on the insulating layer 15 to form a plurality of trenches on the substrate 11. In this step, the insulating layer 15 and the oxide layer 13 are patterned by the photoresist mask 31 to form a plurality of holes (not shown). Then, the substrate 11 is etched by the holes to form the trenches. It should be noted that the trenches are formed on the pre-determined array area 71, and not formed on the pre-determined periphery area 72, but the disclosure is not limited thereto.

Figure 2:
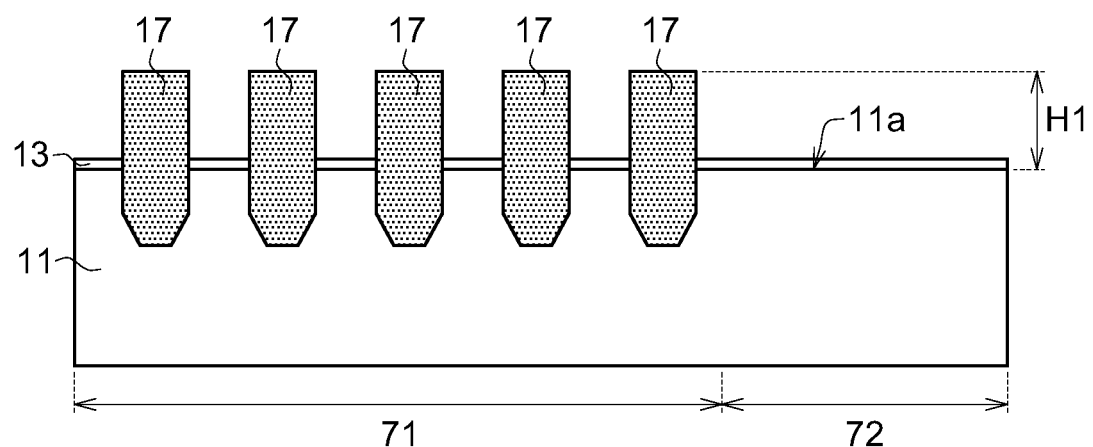

Then, insulating material is deposited in the trenches of the substrate 11 and holes of the insulating layer 15 (and the oxide layer 13). That is, the trenches are filled with insulating material to form at least one insulating layer 17. The photoresist mask 31 and the insulating layer 15 are removed to form the structure as shown in FIG. 2. In this embodiment, the height H1 of the insulating layer 17 higher than the top surface 11a of the substrate 11 may be between 800 and 1000 Å, and the insulating layer 17 may include silicon dioxide ($SiO_2$).

Figure 3:
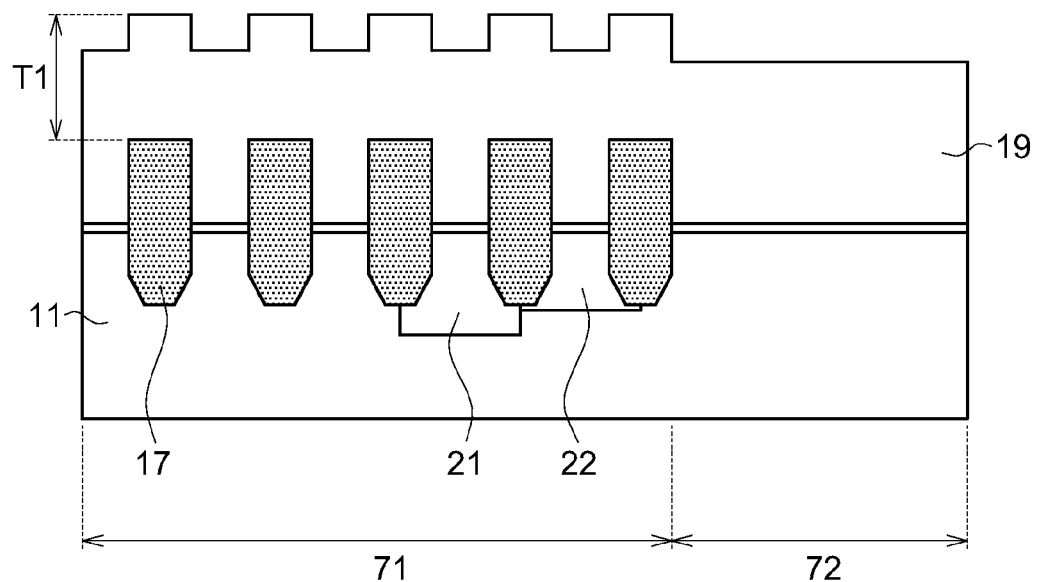

As shown in FIG. 3, at least one n-type well 21 and p-type well 22 are formed in the array area 71 by doping impurities in the substrate 11. In this embodiment, the n-type well 21 and the p-type well 22 are high voltage (HV) wells. It should be noted that other elements (which are not shown) may be formed in the array area 71, and FIG. 3 is merely as an illustrative sense rather than a restrictive sense.

Then, a polysilicon layer 19 is deposited on the substrate 11 and the insulating layer 17. In this embodiment, the thickness T1 of the deposited polysilicon layer 19 on the substrate 11 and the insulating 17 may be between 1800 and 2200 Å. It should be noted that the thickness T1 of the polysilicon layer 19 is defined as the average thickness of the polysilicon layer 19, since the polysilicon layer 19 is not completely flat.

Figure 4:
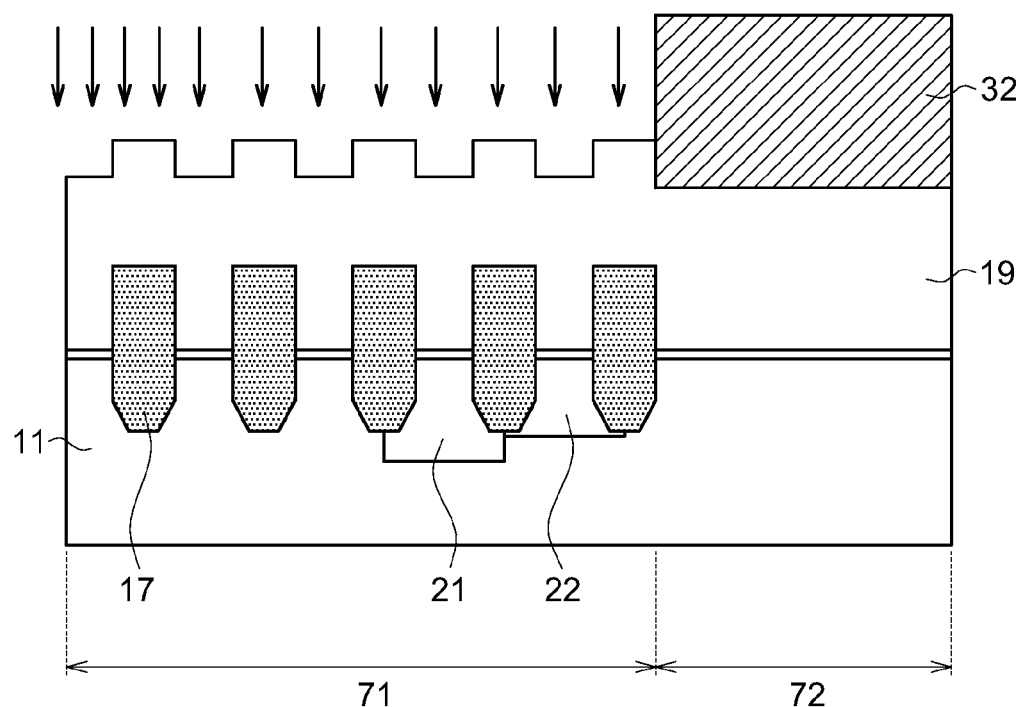

As shown in FIG. 4, a photoresist mask 32 is formed on the polysilicon layer 19 on the pre-determined periphery area 72. Then, a portion of the polysilicon layer 19 on the array area 71 is etched. In this embodiment, the removal thickness E1 (shown in FIG. 5) of the polysilicon layer 19 on the array area 71 during the etching process may be between 25 and 50% of the thickness T1 of the polysilicon layer 19 as shown in FIG. 3. For example, the removal thickness E1 of the polysilicon layer 19 may be between 500 and 1000 Å. However, the disclosure is not limited thereto. Similarly, it should be noted that the removal thickness E1 of the polysilicon layer 19 is defined as the average thickness of the etched polysilicon layer 19, since the polysilicon layer 19 is not completely flat.

Figure 5:
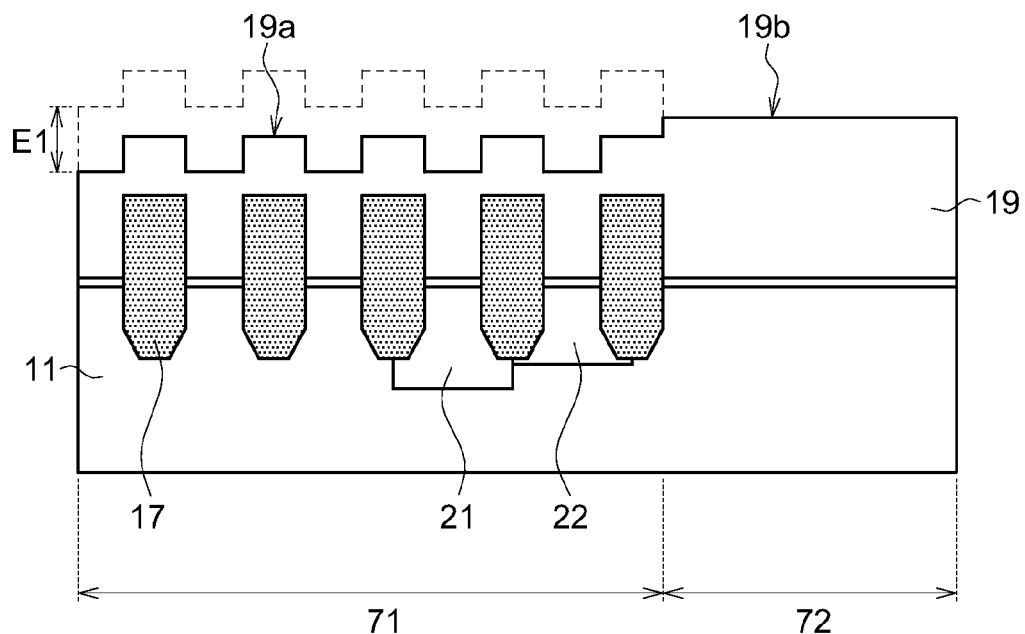

As shown in FIG. 5, the photoresist mask 32 is removed. In this embodiment, the top surface 19a of the polysilicon layer 19 on the array area 71 is higher than the first insulating layer 17 and lower than the top surface 19b of the polysilicon layer 19 on the periphery area 72 after the etching process.

Figure 6:
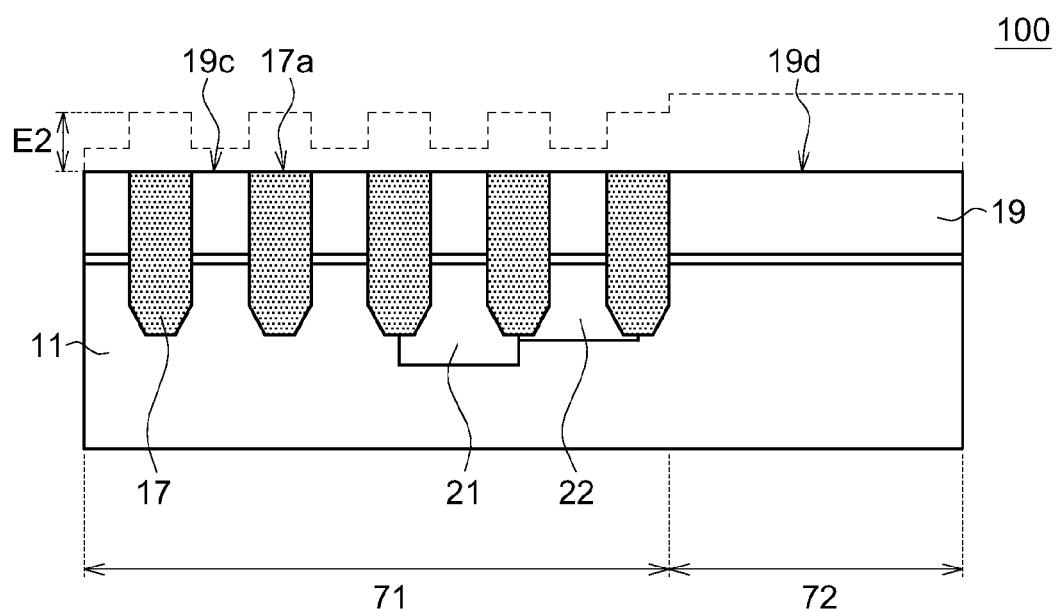

As shown in FIG. 6, a planarization process is implemented to remove a portion of the polysilicon layer 19 on the array area 71 and on the periphery area 72 to form the semiconductor structure 100. In this embodiment, the planarization process may be a buffer chemical-mechanical polishing (CMP) process.

Further, the removal thickness E2 of the polysilicon layer 19 during the step of planarization process may be between 5 and 15% of the thickness T1 of the polysilicon layer 19 as shown in FIG. 3. For example, the removal thickness E2 of the polysilicon layer 19 may be between 100 and 300 Å. However, the disclosure is not limited thereto. Similarly, it should be noted that the removal thickness E2 of the polysilicon layer 19 is defined as the average thickness of the polished polysilicon layer 19.

After the planarization process, the top surface 17a of the insulating layer 17 and the top surface 19c of the polysilicon layer 19 (on the array area 71) may be coplanar. Further, the top surface 19c of the polysilicon layer 19 on the array area 71 and the top surface 19d of the polysilicon layer 19 on the periphery area 72 may be coplanar.

Figure 7:
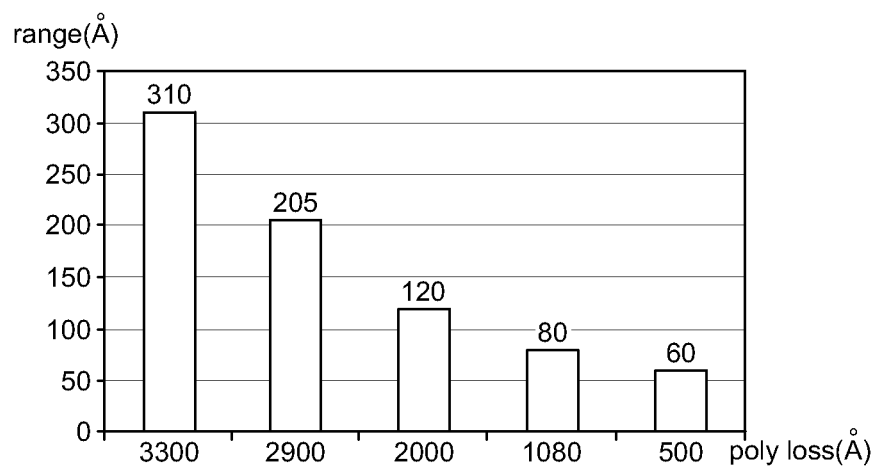
FIG. 7 shows a plot of thickness range versus poly loss.

FIG. 7 shows a plot of thickness range versus poly loss. In this figure, the thickness range may represent the degree of the uniformity obtained by measuring thickness of different locations in a wafer, and poly loss may represent the total removal thickness of the polysilicon layer during the manufacturing process. As shown in FIG. 7, when the poly loss is lower than 1080 Å, the thickness range may be within 80 Å.

In the traditional manufacturing method of the semiconductor structure, when the step height (the height of shallow trench isolation) is about 900 Å, it needs 4,000 Å of poly loss to achieve the complete planarization, which is even higher than the case of 3300 Å of poly loss shown in FIG. 7. As such, there may be a large thickness range. In other words, the traditional manufacturing method may lead to a worse uniformity within the wafer.

However, the total removal thickness of the polysilicon layer during the manufacturing process according to the disclosure may be reduced compared to the traditional manufacturing method. That is, the manufacturing method in the embodiment according to the disclosure may form the wafer having better uniformity, and reduce the influence of the step height (e.g. the height H1 of insulating layer 17) to micro-loading of the semiconductor structure.

Further, it is easy to control the height and width of the floating gate (e.g. polysilicon layer 19) more precisely by the reverse mask (the photoresist mask 32) process in the embodiment according to the disclosure. Through the manufacturing method mentioned above, the micro-loading issue and the uniformity within the wafer may be effectively improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A manufacturing method of a semiconductor structure having an array area and a periphery area, the manufacturing method comprising:
   providing a substrate;
   forming a plurality of trenches on the substrate;
   filling the trenches with insulating material to form at least one first insulating layer;
   depositing a polysilicon layer on the substrate and the first insulating layer;
   forming a photoresist mask on the periphery area;
   etching a portion of the polysilicon layer on the array area, such that a top surface of the polysilicon layer on the array area is higher than the first insulating layer and lower than a top surface of the polysilicon layer on the periphery area;
   removing the photoresist mask; and
   implementing a planarization process to remove a portion of the polysilicon layer on the array area and on the periphery area.

2. The manufacturing method according to claim 1, wherein the step of forming the trenches comprises:
   depositing a second insulating layer;
   patterning the second insulating layer to form a plurality of holes; and
   etching the substrate by the holes to form the trenches.

3. The manufacturing method according to claim 2, wherein the step of filling the trenches comprises:
   depositing insulating material in the trenches and the holes of the second insulating layer; and
   removing the second insulating layer.

4. The manufacturing method according to claim 2, wherein the second insulating layer comprises silicon nitride.

5. The manufacturing method according to claim 1, wherein a height of the first insulating layer higher than a top surface of the substrate is between 800 and 1000 Å.

6. The manufacturing method according to claim 1, wherein a first thickness of the deposited polysilicon layer on the substrate and the first insulating layer is between 1800 and 2200 Å after the step of depositing the polysilicon layer.

7. The manufacturing method according to claim 6, wherein a first removal thickness of the polysilicon layer on the array area during the step of etching the portion of the polysilicon layer on the array area is between 25 and 50% of the first thickness.

8. The manufacturing method according to claim 7, wherein the first removal thickness of the polysilicon layer is between 500 and 1000 Å.

9. The manufacturing method according to claim 6, wherein a second removal thickness of the polysilicon layer during the step of planarization process is between 5 and 15% of the first thickness.

10. The manufacturing method according to claim 9, wherein the second removal thickness of the polysilicon layer is between 100 and 300 Å.

11. The manufacturing method according to claim 1, wherein the planarization process is a chemical-mechanical polishing process.

12. The manufacturing method according to claim 1, wherein the first insulating layer comprises silicon dioxide.

13. The manufacturing method according to claim 1, wherein a top surface of the first insulating layer and the top surface of the polysilicon layer are coplanar after the planarization process.

14. The manufacturing method according to claim 1, wherein top surface of the polysilicon layer on the array area and the top surface of the polysilicon layer on the periphery area are coplanar after the planarization process.

* * * * *